United States Patent [19]

Ngo

[11] B 3,991,341

[45] Nov. 9, 1976

[54] PLASMA DISCHARGE SHIFT REGISTERS

[75] Inventor: Peter Dinh-Tuan Ngo, Colts Neck, N.J.

[73] Assignee: Bell Telephone Laboratories, Incorporated, Murray Hill, N.J.

[22] Filed: Nov. 4, 1974

[21] Appl. No.: 520,613

[44] Published under the second Trial Voluntary Protest Program on March 16, 1976 as document No. B 520,613.

[52] U.S. Cl. .......................... 315/169 TV; 313/217; 340/324 M
[51] Int. Cl.² ........................................ H05B 37/00
[58] Field of Search .............. 315/169 TV; 313/217; 340/324 M

[56] References Cited
UNITED STATES PATENTS 3,839,713   10/1974   Urade et al. ............... 315/169 TV X
3,878,430   4/1975    Hirose ......................... 315/169 TV Primary Examiner—R. V. Rolinec
Assistant Examiner—Lawrence J. Dahl
Attorney, Agent, or Firm—William Ryan

[57] ABSTRACT

A planar plasma discharge shift register includes a plurality of electrodes of a first polarity and a unitary electrode of the opposite polarity. Multi-phase clock signals applied in succession to each of the pluralities of electrodes cause a plasma discharge, once initiated, to propagate in controlled fashion along a path prescribed by the location of the electrodes. By suitable shaping of the electrodes, and through a judicious choice of clock signals, it is possible to propagate a gaseous discharge bi-directionally.

13 Claims, 11 Drawing Figures

PLASMA DISCHARGE SHIFT REGISTERS

BACKGROUND OF THE INVENTION

1. Field of the Invention

The present invention relates to plasma discharge devices. More particularly, the present invention relates to devices for propagating a plasma discharge along a prescribed path. Still more particularly, the present invention relates to planar plasma discharge shift register apparatus and circuitry for controlling the same.

2. Prior Art

Although plasma discharge cells have found increased use in recent years in display applications, such use has primarily involved the use of 2-dimensional matrix arrays constituting a plasma panel. Such plasma panels, described, for example, in U.S. Pat Nos. 3,559,190 issued to D. L. Bitzer et al, on Jan. 26, 1971, and 3,499,167 issued to T. C. Baker et al on Mar. 3, 1970, typically operate in a half-select mode in response to signals applied on horizontal and vertical addressing electrodes. While such panels are appropriate for many applications, their relatively complicated structure and extensive drive circuitry give rise to complexity and expense not justified for many applications.

One attempt to provide for simpler plasma discharge display devices involves the use of devices for propagating a plasma discharge in a manner analogous to information transfer by electrical signals in shift register circuits. Thus, for example, U.S. Pat. Nos. 3,781,600 issued to W. E. Coleman et al on Dec. 25, 1973; 3,775,764 issued to J. P. Gaur on Nov. 27, 1973; and 3,795,908 issued to A. W. McDowell et al on Mar. 5, 1974 describe such devices. Each of the above-cited shift register structures has in common with the earlier-mentioned plasma panel arrangements the characteristic that plasma discharge control electrodes are disposed on opposite sides of a gas volume by providing a "sandwich" of separate glass substrates separated by glass or other dielectric structures. Such arrangements suffer from the limitation tht the gas discharge occurs between the electrodes and is therefore at least partly obscured by the electrodes themselves. This is true even in those cases where nominally transparent conductors are used. Further, the need for precise registration of opposing electrodes imposes strict tolerances on the sandwich elements.

In U.S. Pat. No. 3,798,502 issued on Mar. 19, 1974 to P. D. Ngo, there is disclosed an essentially planar structure including a plurality of plasma discharge cells in a shift register configuration. Because all electrodes are deposited by thick film or equivalent techniques on a single substrate, the entire glow discharge is available for direct viewing.

SUMMARY OF THE INVENTION

The present invention in typical embodiment provides modifications to the structure disclosed in the above-cited Ngo patent to improve control over the propagating gas discharge. In particular, through the use of various electrode geometries and associated control signals, it has been found possible to reduce the possibility of inadvertent reverse propagations of the gas discharge. In those cases where bi-directional propagation is desirable, alternative embodiments provide variations in electrode structure and clock signals to permit such a result.

DETAILED DESCRIPTION

U.S. Pat. No. 3,798,502, cited above, issued to me on Mar. 19, 1974 shows a number of structures useful in generating a plasma discharge and propagating such a discharge along a prescribed path. This last-mentioned patent, hereinafter referred to as the Ngo patent, is hereby incorporated by reference and should be considered as if set out in its entirety herein.

Specifically, the Ngo patent shows, inter alia, both single-sided (single-anode-single-cathode) structures and double-sided (double-anode-single-cathode) structures. Of course, in appropriate cases the roles played by the anodes and cathodes described in the Ngo patent may be reversed.

Figure 1:
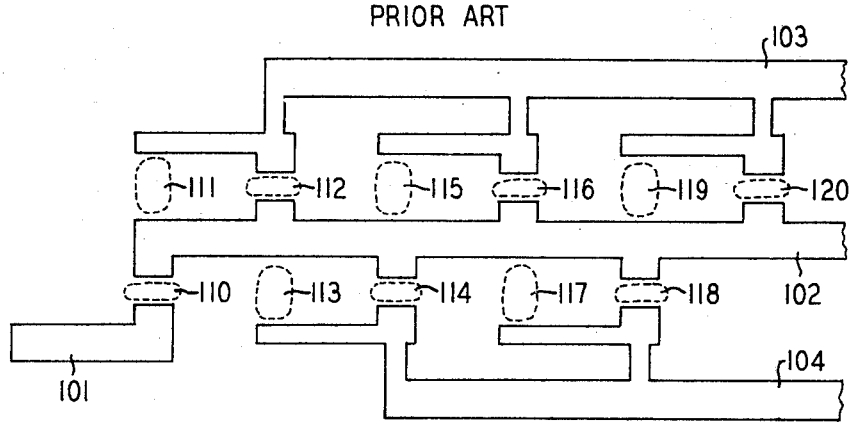
FIG. 1 shows a prior art planar plasma discharge shift register.
Figure 3:
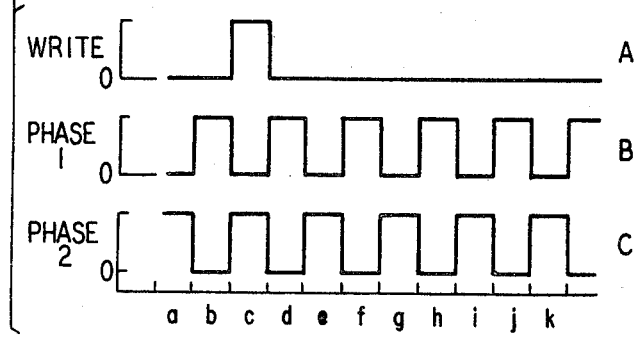
FIG. 3 shows clock signals useful in connection with the structure of FIGS. 1 and 2.

FIG. 1 shows a construction for a two-sided shift register based on the structure of FIG. 3 of the Ngo patent. A discharge is initiated between write anode 101 and cathode 102 at location 110 during a given clock cycle. In subsequent clock cycles this discharge is propagated along cathode 102 and anodes 103 and 014 to the right via locations 111-120. Odd numbered discharge locations identify temporary "pickup-tip" discharges, while evennumbered locations are stable discharge locations. Additional electrode shaping, e.g., that shown in FIG. 3 of the Ngo patent to bring a pickup tip closer to an existing stable discharge location, can be used to improve margins.

Figure 2:
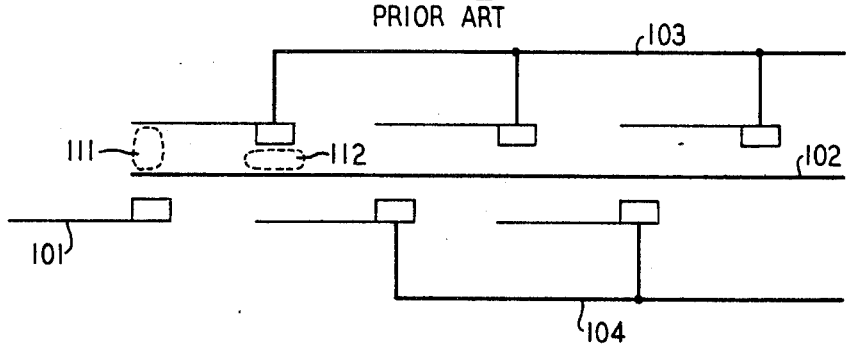
FIG. 2 shows a schematic representation of the structure of the shift register of FIG. 1.

To simplify future drawing figures, schematic elements of the type shown in FIG. 2 will be used to represent identically numbered structural elements shown in FIG. 1. Thus, e.g., the stable discharge locations are identified with small rectangles, while unstable discharge locations are represented only by an end point of a line segment; the conducting electrodes 102, 103 and 104 are likewise represented by line segments.

FIG. 3 shows a write signal (waveform A) and 2-phase clock signals suitable for generating and propagating a discharge along the structure of FIGS. 1 and 2. PHASE 1 signals (waveform B) are advantageously applied to anode 103 and PHASE 2 signals (waveform C) to anode 104.

The structure of FIGS. 1 and 2 can be slightly modified to facilitate the reversal of roles of the electrodes, i.e., to interchange cathode and anode electrodes. In some applications, it may prove advantageous to have the external electrodes be cathodes. Thus, in particular, if the external electrodes are arranged to be cathodes, a transfer of a discharge from one shift register to another may be accomplished more easily because the glow discharge actually takes place adjacent the cathode elements.

Figure 4:
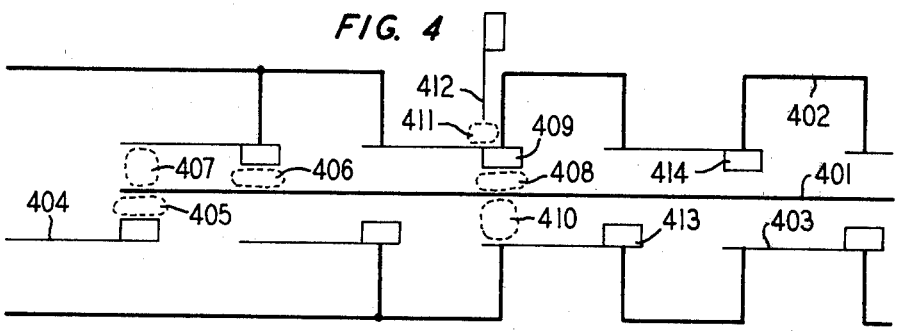
FIG. 4 shows a modification of the shift register in FIGS. 1 and 2 that permits the transfer of a glow discharge to another shift register.

FIG. 4 illustrates a structure for achieving the last-mentioned ease of transfer. specifically, a single anode 401 is placed intermediate cathodes 402 and 403. Write electrode 404 is arranged by virtue of write signals applied to it to generate an initial discharge between itself and anode 401, this discharge being located at position 405. In subsequent clock cycles the discharge at location 405 is transferred to location 406 by way of location 407 in now standard fashion. During subsequent clock intervals the glow is propagated to a location such as 408. At this point, because of the accessability of the discharge site electrode 409, a transfer is possible to either location 410 or 411 or to both locations simultaneously. Location 412 may advantageously form a pick-up tip for a separate glow discharge shift register of the type shown in FIGS. 1 and 2. Thus coupling between registers is more readily accomplished when there is relatively easy access to a cathode electrode position such as 409 in FIG. 4.

Other pick-up tips may, of course, be located at electrode position 413, 414, or other such "exposed cathode locations." All that is required is an additional pick-up electrode with an appropriate potential applied thereon. Because of the reversal of roles played by the center and external electrodes as compared with the structure of FIGS. 1 and 2, all that is required is a simple reversal of polarity of the signals shown in FIG. 3, and (for the pick-up electrode 412) a voltage like that otherwise applied to cathode 403 in the structure of FIG. 4.

In the several structures disclosed in the Ngo patent and in the preceding discussion, one important consideration is suitable control over the direction of shifting of the glow discharge. In particular, it is desirable to prevent a backward propagation in many circumstances. The two-phase propagating clock signals and corresponding interlaced anodes (or cathodes, in the case of the circuit of FIG. 4) provide suitable control of directivity in many cases. Thus in the structure of FIG. 1, for example, a glow subsisting at location 116 is advantageously transferred immediately to location 117 and thence to stable location 118. It should be clear, however, that the polarity of signals appearing at location 114 are also such that for some space and electrical parameters, a glow at location 116 could be drawn to location 114. The operation of the two-phase circuitry thus far described is, of course, arranged so that a stable glow is subjected to propagating signals which preferentially direct the discharge in one direction. As noted earlier, shaping of a pick-up tip to bring it into closer proximity to a stable discharge is one technique which has been used to advantage to ensure the desired directivity. At base, however, glow propagating systems with desired unidirectivity must rely on substantial deionization at one location, e.g., location 114 in FIG. 1, as compared with the state of ionization of the gas medium at another location, e.g., preferred "next" location 117 in FIG. 1. That is, the actual direct control mechanism for directing discharge direction is that of relatively enchanced states of ionization to promote a discharge.

A particular gas environment is characterized by unique characteristics with respect to rate of ionization and deionization. Thus gas composition, pressure, and temperature (and, of course, electrode spacing and shaping) will cause a particular voltage to create a predictable degree of ionization. Similarly, when such applied voltages are removed, the gas will return to a deionized state in large part dependent on the aforecited physical parameters. Actual deionization is a relatively complex phenomenon not susceptible of succinct description, or even complete understanding. There is, however, a characteristic time $\tau_d$ during which, by virtue of recombination of ions and other equilibria phenomena, a substantially complete deionization occurs.

It should be clear that if the time $\tau_d$ is larger than a clock interval T, such as those labeled with lower code letters in FIG. 3, a reverse propagation of a glow discharge remains a distinct possibility.

While shaping of the electrodes in a two-phase system such as that shown in FIG. 1 and described in the Ngo patent provides a substantial measure of protection against such backward propagation, there are other cases where a greater degree of protection is desired. This is especially true where it is required that propagation proceed at a relatively high rate, thereby requiring T to be relatively short.

Figure 5:
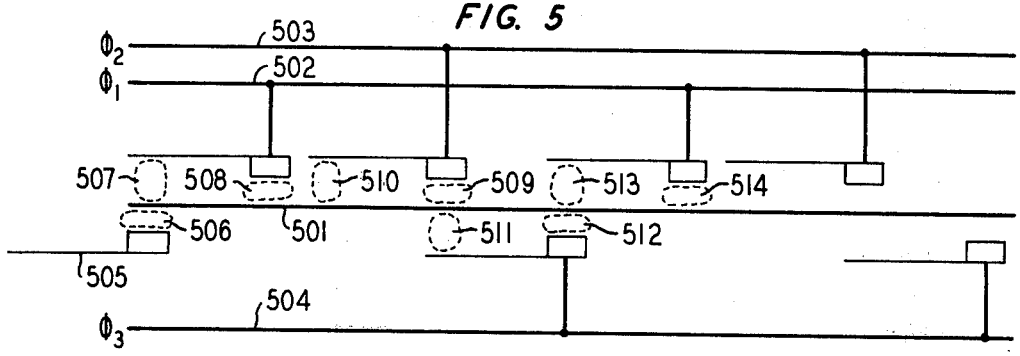
FIG. 5 shows a 3-phase shift register in accordance with one embodiment of the present invention.

FIG. 5 shows a three-phase glow discharge shift register based on the earlier teachings and providing an increased protection against inadvertent backward propagation. A single cathode 501 is arranged centrally with respect to three anodes 502, 503 and 504. As in previously described arrangements, a write anode 505 establishes an initial glow at location 506 which is then propagated by way of pick-up tip discharge location 507 to stable discharge location 508. From there the glow discharge is transferred to stable discharge location 509 by way of pick-up location 510. FIG. 5 differs from the structure of FIGS. 1 and 2, for example, by virtue of the fact that the glow is maintained on the same side of the cathode (here 501) for two consecutive clock cycles. In the clock cycle following that in which the glow is established at location 509, a transfer of the discharge to pick-up location 511 and thence to stable location 512 is accomplished. The process is then repeated to effect a transfer of the glow dishcarge to the right in FIG. 5.

Figure 6:
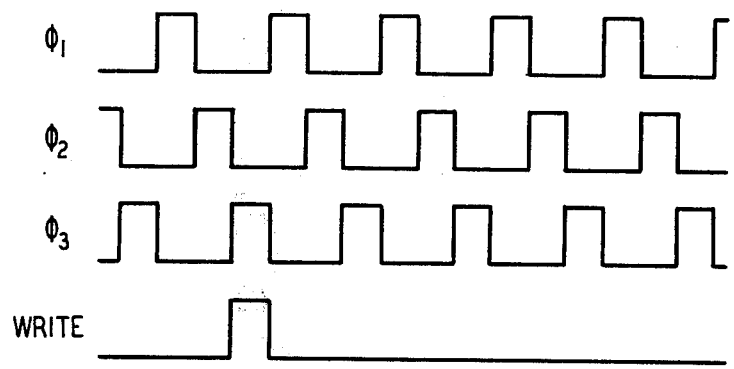
FIG. 6 shows clock signals useful in connection with the circuitry of FIG. 5.

FIG. 6 shows clock and write signals appropriate for application to the circuit elements shown in FIG. 5.

The enhanced unidirectivity of the structure of FIG. 5 is achieved in large part by virtue of the fact that the $\phi_1$ clock signals supplied on anode 502, e.g., are used only for establishing discharges at locations which are separated by two intermediate discharge electrodes. Thus by the time a glow is propagated from location 508 by way of locations 509 and 512, the state of deionization at location 508 is substantially complete and a transfer to pick-up location 513 and stable discharge location 514 is greatly preferred because of the elevated level of ionization at these latter sites. The ionization occurs, of course, by virtue of the pre-existing discharge at location 512 as described in the Ngo patent.

Figure 7:
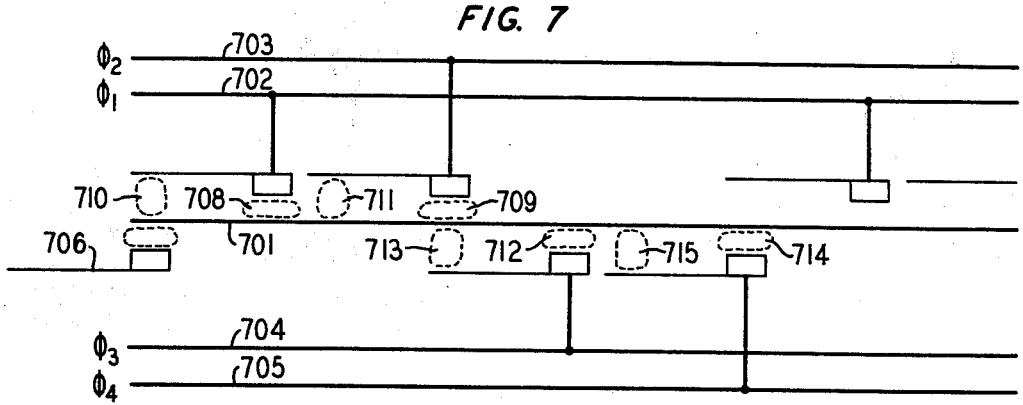
FIG. 7 shows a 4-phase shift register in accordance with another embodiment of the present invention.

FIG. 7 shows a 4-phase arrangement for further insuring against backward propagation of a glow discharge. As before, a glow is initiated between a cathode 701 and a write electrode 706 at location 707. During subsequent clock intervals the glow is propagated to stable discharge locations 708 and 709 by way of respective pick-up discharge locations 710 adn 711. After a stable glow has been established at location 709, a transfer to a stable location at position 712 is achieved by way of pick-up location 713. The structure of FIG. 7 differs from that of FIG. 5, for example, by virtue of the fact that a 4th phase is introduced which causes the glow discharge to propagate from stable location 712 to stable location 714 (by way of pickup location 715), the latter stable location being on the same side of cathode 701 as the immediately preceding discharge location. This pattern of propagation through two stable locations on one side of cathode 701 followed by a discharge at two consecutive locations on the other side of cathode 701 continues in an obvious fashion. Appropriate clock and write signals for the structure of FIG. 7 are shown in FIG. 8.

While some effort has been made in connection with the structure described above to enhance unidirectional operation of a plasma discharge shift register, there are cases where it is appropriate to provide bidirectional shifting of a plasma discharge. For example, many indicator or measuring devices may indicate a desired or actual range of operation involving speeds, pressures, temperatures, and the like. While some existing plasma shift register structures, e.g., that described in "Plasma's Progress: Gas-Discharge Technology Moves Into Analog Realm," by R. Saxon, Electronics, Mar. 7, 1974, pp. 89–93, and "A Linear Glow Discharge Graphical Display and Associated Drive Circuitry," by R. Saxon, *Preprint 1974 IEEE Intercon. Technical Papers, Session* 25, provide for scanning repeatedly over a fixed region, scanning over a region not bounded by one extremity of a plasma shift register device is not possible in the prior art. That is, the last-mentioned prior art devices constitute "bar graph" displays for depicting a value as measured from a fixed reference point. By suitable modification of the structure of the several embodiments of the present invention described above, it is possible to generate a signal not unlike that provided by the apparatus of the above-cited Saxon papers, but having the added advantage that no single fixed reference point for a scan interval is required. Further, the Saxon and related devices require the common "sandwich" structure, rather than the essentially planar structure described in the Ngo patent.

Figure 8:
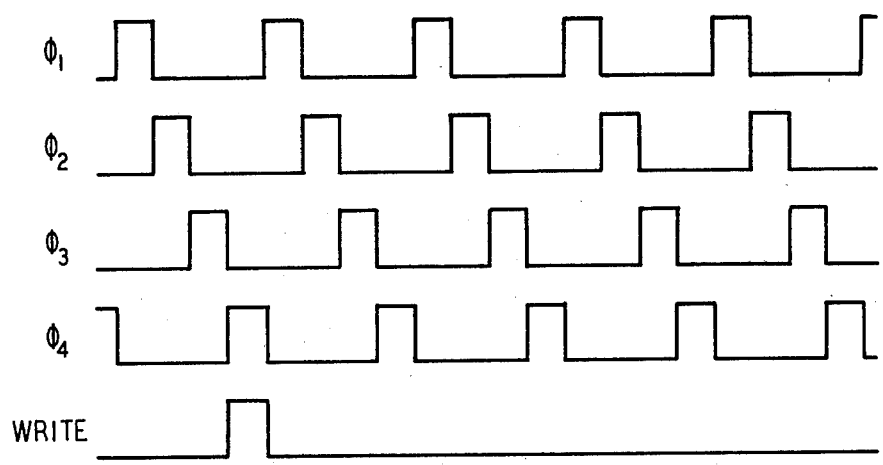
FIG. 8 shows clock signals that are useful in connection with the shift register of FIG. 6.
Figure 9:
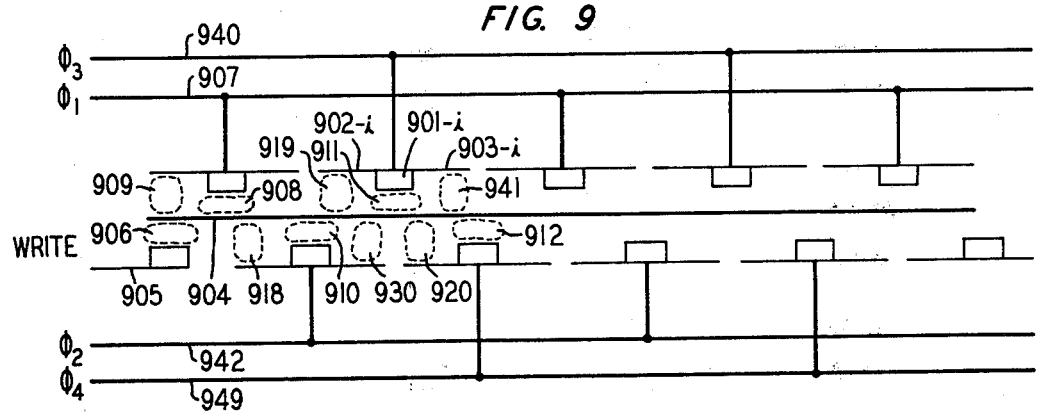
FIG. 9 shows a structure for realizing a bi-directional plasma discharge shift register in accordance with another embodiment of the present invention.

FIG. 9 shows a bidirectional plasma discharge shift register suitable for establishing and propagating a plasma discharge in either or both directions. Again a 4-anode 1-cathode structure is used, the 4 anodes being designated 907, 942, 940, and 949, while the single cathode is identified as 904. it should be noted, however, that each of the anode segments includes a stable discharge location, e.g., 901-i and two associated pick-up tips 902-i and 903-i, each adjacent cathode 904. As in the case of the structure of FIG. 7, a 4-phase arrangement proves to be particularly desirable. The waveforms appearing in FIG. 8 are also suitable for the writing and forward propagation of a glow discharge in the structure of FIG. 9.

When the write signal shown in FIG. 8 is applied to write electrode 905 an initial glow is established at 906. During the next clock cycle the $\phi_1$ signal applied to anode 907 causes the glow discharge to pass to location 908 by way of pick-up tip glow location 909. During the subsequent clock intervals the clock discharge passes sequentially to stable locations 910, 911, 912, etc. by way of respective pick-up tip discharge locations 918, 919, 920, etc.

Though a similarity to the structure of FIG. 7 is evident in FIG. 9, it is not as apparent that a reverseshifting (right to left in FIG. 9) may also be readily achieved with no variation in structure. Thus, in particular, if the clock signals appearing in FIG. 10 are applied to corresponding electrodes in FIG. 9 in place of the clock signals appearing in FIG. 8 (with a discharge having been established at any stable discharge location), an exactly opposite sequence of elemental glow discharge propagations will occur.

Thus, for example, if a glow discharge exists at location 912 (associated with $\phi_4$) and the next localized positive clock pulse appears not on the $\phi_1$ anode 907, but on the $\phi_3$ anode 940, then the glow will propagate not to the right in FIG. 9, but to stable discharge location 911 by way of pick-up tip discharge location 941. Similarly, in the next succeeding clock cycle the $\phi_2$ anode 942 becomes energized to cause a transfer of the glow discharge to location 910 by way of pick-up tip location 930. This pattern then repeats for so long as the clock pulse sequence appearing in FIG. 10 is applied to respective anodes appearing in FIG. 9, or until the discharge passes to pickup tip location 909 where it becomes extinguished.

Figure 10:
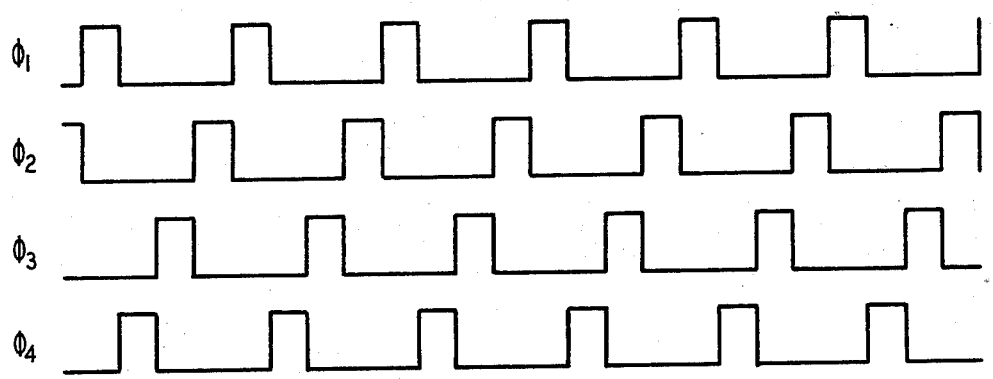
FIG. 10 shows clock signals useful in connection with right-to-left propagation of discharges in the structure of FIG. 9.
Figure 11:
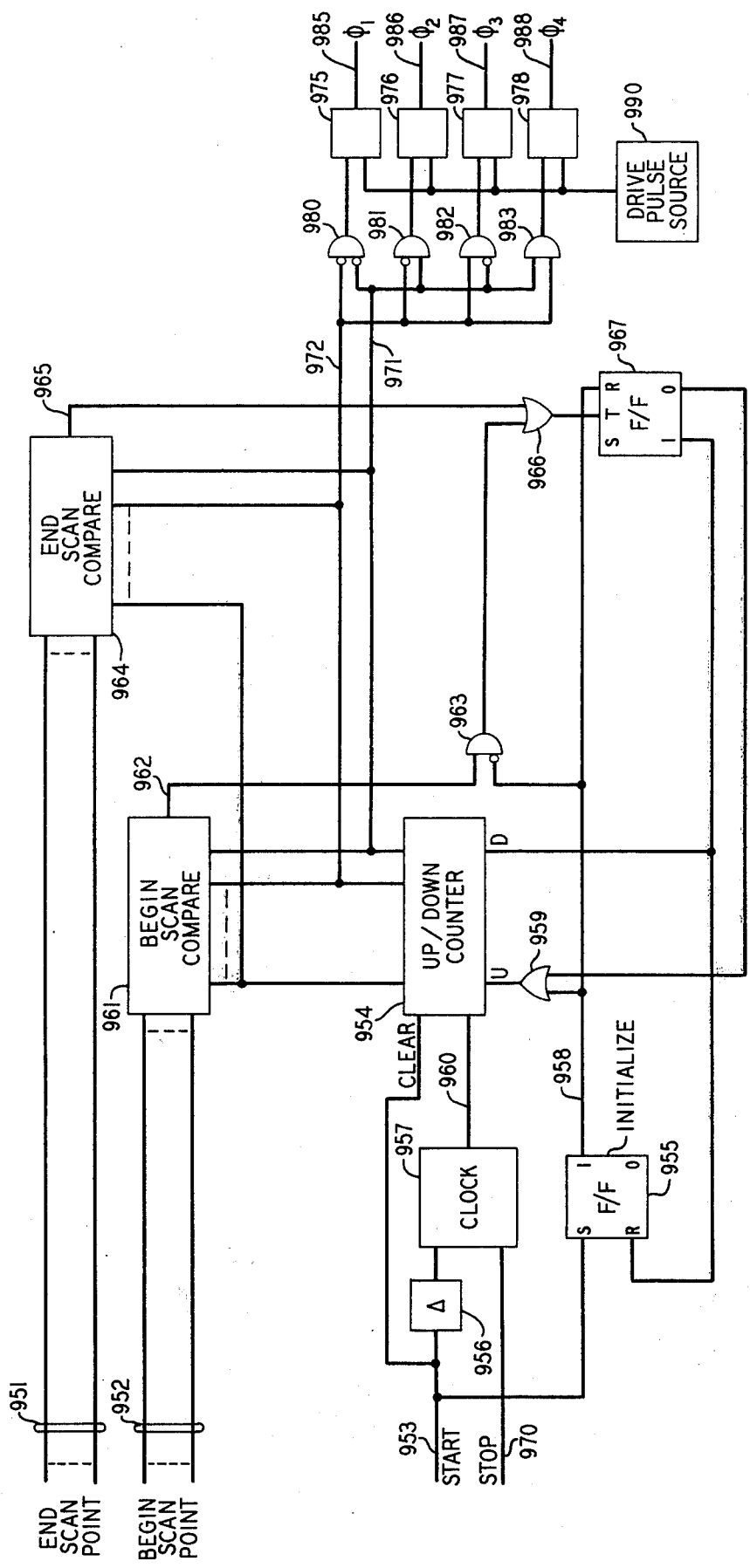
FIG. 11 shows control circuitry for establishing and maintaining a scanned display over a region of the shift register of FIG. 9.

To achieve a scanned display having arbitrary beginning and end points of the type desired, all that need be done, then, is to establish a discharge and cause a recurrent alternation between clock signal patterns of the types appearing in FIGS. 8 and 10. The circuitry appearing in FIG. 11 is suitable for performing this function.

It is assumed that input signals are provided on input leads 951, 952 and 953 indicating, respectively, the end point of a desired scan, the beginning point of a desired scan, and the fact that a scan is to begin. The start or begin scan signal applied on lead 953 is used to clear to an all-zero state an up-down counter 954 and to set an initialize flip-flop 955. After a suitable small delay introduced by delay element 956, the start signal also energizes clock 957 which generates periodic pulses at a rate four times greater than any one of the clock signals appearing in FIGS. 8 and 10.

The setting of the initializing flip-flop 955 causes the up-down counter 954 to be established in the "up" condition by way of a signal appearing on lead 958 which passes via OR gate 959. As clock signals are applied by clock circuit 957 on lead 960, up-down counter 954 is advanced sequentially beginning at the all-zero count. When counter 954 reaches a count equal to the designated "begin scan point" as indicated by the signals on leads 952, a comparator 961 indicates a match by way of a signal on lead 962. This is applied to AND gate 963, but because of the inhibit input connected to lead 958, this output from comparator 961 is inhibited; counter 954 therefore stays in the "up" condition.

Clock signals on lead 960 continue to advance counter 954 until comparator 964 indicates a match between the "end scan point" signals appearing on lead 951 and the count of counter 954. At that time an output signal appearing on lead 965 passes by way of OR circuit 966 to the toggle input of flip-flop 967. This latter flip-flop had previously been established in the reset or 0 condition by the output of flip-flop 955 appearing on lead 958. the signal applied to the toggle input to flip-flop 967 therefore causes a transition to the set or 1 state, thus providing an enabling signal to the "down" selection input to up-down counter 954. Simultaneously, the initializing flip-flop 955 is reset.

The effect of the selection of the "down" input to counter 954 is that the clock signals appearing on lead 960 cause successive decrements of the count registered in counter 954. These decrements continue until comparator 961 again indicates that the "begin scan" point has been reached. This is signalled on lead 962, via AND gate 963 (which no longer has an inhibit signal on its input connected to lead 958) and OR gate 966 to the toggle input of flip-flop 967. Again, the state of flip-flop 967 is changed, this time to the reset or 0 state, causing an enabling signal to be again applied to the "up" selection input to counter 954. Counter 954 is then incremented in response to applied clock signals appearing on input 960 until the end scan comparator 964 registers a match. At this time decrementing again commences. The entire sequence of incrementing and decrementing continues until a stop signal is applied on lead 970.

The least significant two bits of up-down counter 954 are used to perform the actual selection of the sequence of clock pulses to the anodes of the shift register of that appearing in FIG. 9. By an exhaustive translation by AND gates 980-983 of the four possible combinations of 2-bit patterns appearing on leads 971 and 972 (the least significant bit and the second least significant bit, respectively, in counter 954), the output switches 975-978 are selected to pass an appropriately-shaped clock pulse originating in drive pulse source 990 to corresponding output leads 985-988. The drive pulse source is, of course, synchronized with the clock signals on lead 960. These output leads are then connected in obvious fashion to the anodes of FIG. 9.

The preceding detailed description has proceeded largely in terms of a single plasma discharge shift register and associated clock pulses and control circuitry. It should be clear, however, that in appropriate cases a plurality of such shift registers may be advantageously juxtaposed to provide a composite image or a multipart image, e.g., a scanned display representative of an actual variation of a physical parameter and an associated scanned display of a desired or control range for that parameter.

The structure of FIG. 9 and the associated clock pulses shown in FIGS. 8 and 10 might suggest that a single cathode, multi-anode structure is preferred. As shown earlier, however, in connection with the structure of FIG. 4, it often proves advantageous to reverse the anode and cathode roles to, among other things facilitate the transfer of a glow discharge from one shift register to another. Thus, by simply reversing the roles of the cathode and anodes in FIG. 9 it is possible to again facilitate the transfer of a glow discharge between shift registers. Further, though the preferred structure for a single shift register in accordance with the present invention and that described in the cited Ngo patent is for a substantially planar structure, there may be occasions where the coupling from a single shift register may advantageously be to another shift register in a different, e.g., perpendicular plane.

Other changes to the structure described above are also possible, of course. Thus, for example, while straightline anodes and cathodes have been illustrated in the drawing, nevertheless it is possible with no substantial increase in complexity to provide for curvilinear structures.

The techniques useful in fabricating the structures indicated in the prior art Ngo patent are equally applicable to the presently disclosed structures. Thus, thick film processing or other equivalent processing may be used as appropriate. As in the earlier Ngo patent, a sealed envelope containing an appropriate gaseous atmosphere is used to enclose the several shift register structures described above. The amplitudes and durations for clock and write signals are also substantially equal to those used in the prior art, including the cited Ngo patent. Thus, the write signals are usually of greater amplitude than the shifting clock signals. Drive and control circuitry represented schematically in the above detailed descriptions includes only standard digital logic circuitry and pulse drivers commonly used in the art.

Further, while 3- and 4-phase structures and clock signals have been illustrated, still greater margins obtain when using an even higher number of clock phases. Finally, though electrodes of a given polarity for a given shift register have been shown above to advantageously lie on both sides of the unitary electrode of the opposite polarity, in some applications all anodes, e.g., may be positioned in interleaved fashion on only one side of a cathode. Such "one-sided" structures may, e.g., enhance coupling to other shift registers.

What is claimed is:

1. Apparatus for propagating a gaseous discharge comprising
    a substantially planar substrate,
    a unitary conducting electrode positioned on said substrate,
    a first ordered plurality of conducting electrodes positioned on said substrate adjacent said unitary path,
    means selectively interconnecting said first plurality of electrodes to form N ≥ 3 sets of electrodes, all electrodes in each set being electrically interconnected, and all electrodes in any one set being electrically insulated from any electrode in any other set, electrodes in each of said sets being positioned in a repetitive ordered pattern with respect to electrodes in each of other sets, with each of said patterns including one and only one electrode from the ith of said sets, i=1, 2, ..., N and with said one electrode from the jth of said sets being positioned intermediate an electrode from the (j-1)th of said sets and an electrode from the (j+1)th of said sets, j=2, 3,..., N-1,
    each of said first plurality of electrodes having a first region defining a stable discharge location between that electrode and said unitary electrode and at least a second region defining one or more unstable discharge locations between that electrode and said unitary electrode, and
    means for sequentially applying an N-phase potential across said first plurality of electrodes and said unitary electrode the ith phase of said N-phase potential being applied to the ith set of said first plurality of electrodes
    whereby a gaseous discharge existing at a discharge location on one of said first plurality of electrodes is controllably propagated through discharge locations on successively adjacent ones of said electrodes 2. Apparatus according to claim 1 further comprising an envelope surrounding said substrate and electrodes thereon and containing a gaseous atmosphere capable of maintaining a glow discharge in response to applied potential differences.

3. Apparatus according to claim 1 wherein said sequentially applied potential differences are substantially equal for each phase, and wherein said apparatus further comprises a write electrode adjacent said unitary electrode, and means for applying a write signal between said unitary electrode and said write electrode to initially establish a glow discharge.

4. Apparatus according to claim 1 wherein said unitary electrode is substantially linear, including curvilinear.

5. Apparatus according to claim 4 wherein said first plurality of conducting electrodes is positioned on one side of said unitary electrode.

6. Apparatus according to claim 4 wherein said sets of electrodes in said first plurality of electrodes includes at least one set on each side of said unitary electrode.

7. Apparatus according to claim 6 wherein N=3.

8. Apparatus according to claim 6 wherein said first plurality of electrodes comprises 4 sets, each comprising a substantially equal number of electrodes, successive ones of said electrodes being on alternate sides of said unitary electrode.

9. Apparatus according to claim 6 wherein said first plurality of electrodes comprises 4 sets, each comprising a substantially equal number of electrodes, each of said patterns including electrodes in odd-numbered sets on one side of said unitary electrode, and electrodes in even-numbered sets on the opposite side of said unitary electrode, whereby a glow may be propagated in either direction along said unitary electrode.

10. Apparatus according to claim 9 wherein said means for applying an N-phase potential differences comprises control means for applying alternative sequences of potential corresponding to each of two directions along said unitary electrode.

11. Apparatus according to claim 10 wherein said control means comprises
a source of clock signals,
a drive pulse source responsive to said clock signals for generating a sequence of drive signals, each corresponding to the potential difference suitable for application across said unitary electrode and one of said first plurality of electrodes, and
selection means for successively directing said drive signals to successive sets of said first plurality of electrodes and said unitary electrode.

12. Apparatus according to claim 11 wherein said selection means comprises means for repetitively scanning said drive signals in alternate directions over a subset of said first plurality of electrodes.

13. Apparatus according to claim 12 wherein said means for repetitively scanning comprises a reversible counter which counts up in response to said clock signals until a predetermined maximum count is reached, at which time said counter counts down in response to said clock signals until a predetermined minimum count is reached, the up-space and down-counting thereby alternating until said clock signals cease to be applied to said counter, said maximum and minimum counts corresponding to end points of said subset of said first plurality of electrodes.

* * * * *